(12) United States Patent
Oh et al.

(10) Patent No.: US 11,172,153 B2
(45) Date of Patent: Nov. 9, 2021

(54) PIXEL CIRCUIT

(71) Applicant: Himax Imaging Limited, Tainan (TW)

(72) Inventors: Hack soo Oh, Tainan (TW); Yu Hin Desmond Cheung, Tainan (TW); Kihong Kim, Tainan (TW)

(73) Assignee: Himax Imaging Limited, Tainan (TW)

( * ) Notice: Subject to any disclaimer, the term of this patent is extended or adjusted under 35 U.S.C. 154(b) by 0 days.

(21) Appl. No.: 16/826,305

(22) Filed: Mar. 23, 2020

(65) Prior Publication Data

US 2020/0221047 A1 Jul. 9, 2020

Related U.S. Application Data

(62) Division of application No. 16/181,345, filed on Nov. 6, 2018, now Pat. No. 10,917,596.

(60) Provisional application No. 62/724,042, filed on Aug. 29, 2018.

(51) Int. Cl.
| | |
|---|---|
| *H04N 5/3745* | (2011.01) |
| *H04N 5/378* | (2011.01) |
| *H01L 27/146* | (2006.01) |
| *H04N 5/353* | (2011.01) |

(52) U.S. Cl.
CPC ......... *H04N 5/37452* (2013.01); *H04N 5/378* (2013.01); *H01L 27/14641* (2013.01); *H04N 5/353* (2013.01)

(58) Field of Classification Search
CPC .... H04N 5/37452; H04N 5/378; H04N 5/353; H01L 27/14641; G09G 3/20
USPC ...................................................... 348/294
See application file for complete search history.

(56) References Cited

U.S. PATENT DOCUMENTS

| | | | |
|---|---|---|---|
| 7,224,389 B2 | 5/2007 | Dierickx | |
| 9,728,578 B2 | 8/2017 | Storm | |
| 9,961,262 B2 | 5/2018 | Okura | |
| 9,967,504 B1 | 5/2018 | Manabe | |
| 10,103,193 B1* | 10/2018 | Manabe | ............ H01L 27/14643 |
| 2003/0011694 A1 | 1/2003 | Dierickx | |
| 2012/0147237 A1 | 6/2012 | Xu | |
| 2015/0130977 A1 | 5/2015 | Ladd | |

(Continued)

FOREIGN PATENT DOCUMENTS

| | | |
|---|---|---|
| CN | 1738358 A | 2/2006 |
| CN | 101273619 A | 9/2008 |

(Continued)

*Primary Examiner* — Lin Ye
*Assistant Examiner* — Chan T Nguyen
(74) *Attorney, Agent, or Firm* — Winston Hsu

(57) ABSTRACT

A pixel circuit is disclosed. The pixel circuit includes a photodiode (PD), a transmission circuit, a reset circuit, a signal storage circuit and a buffer circuit. The transmission circuit is coupled between the PD and an ordinary floating diffusion (FD) node. The reset circuit is coupled to the ordinary FD node. The signal storage circuit is coupled to the ordinary FD node. The buffer circuit is coupled to the ordinary FD node. The signal storage circuit may store a PD signal on a specific node having a reduced leakage path in comparison with the ordinary FD node during a holding phase of the pixel circuit, wherein the holding phase is a time interval starting from a first time point at which the PD signal is stored on the specific node and ending at a second time point at which the pixel circuit is selected for performing a read-out operation.

7 Claims, 10 Drawing Sheets

(56) References Cited

U.S. PATENT DOCUMENTS

| | | | |
|---|---|---|---|
| 2015/0208009 A1 | 7/2015 | Oh | |
| 2016/0028974 A1 | 1/2016 | Guidash | |
| 2016/0150175 A1 | 5/2016 | Hynecek | |
| 2017/0302836 A1 | 10/2017 | Okura | |
| 2017/0323912 A1 | 11/2017 | Lahav | |
| 2017/0359543 A1 | 12/2017 | Kim | |
| 2018/0033809 A1 | 2/2018 | Tayanaka | |
| 2018/0063459 A1 | 3/2018 | Stark | |
| 2018/0213174 A1* | 7/2018 | Sano | H04N 5/37455 |
| 2018/0240837 A1 | 8/2018 | Chen | |
| 2018/0295303 A1* | 10/2018 | Murao | H04N 5/37457 |
| 2018/0332247 A1 | 11/2018 | Do | |
| 2019/0181171 A1 | 6/2019 | Tadmor | |
| 2019/0230294 A1 | 7/2019 | Singh | |
| 2020/0092505 A1 | 3/2020 | Sano | |

FOREIGN PATENT DOCUMENTS

| | | |
|---|---|---|
| CN | 101835003 A | 9/2010 |
| CN | 102447848 A | 5/2012 |
| CN | 205566484 U | 9/2016 |
| CN | 206283595 U | 6/2017 |
| CN | 107040731 A | 8/2017 |
| CN | 206977570 U | 2/2018 |
| JP | 2006-148284 A | 6/2006 |
| JP | 2018-11272 A | 1/2018 |
| TW | 201120709 A1 | 6/2011 |
| TW | I433537 B | 4/2014 |
| TW | I573463 B | 3/2017 |
| TW | 201719874 A | 6/2017 |
| TW | 201729410 A | 8/2017 |

\* cited by examiner

PIXEL CIRCUIT

CROSS REFERENCE TO RELATED APPLICATIONS

This application is a divisional application of U.S. patent application Ser. No. 16/181,345, which claims the benefit of U.S. provisional application No. 62/724,042, filed on Aug. 29, 2018. The entire contents of the related applications, including U.S. patent application Ser. No. 16/181,345 and U.S. provisional application No. 62/724,042, are incorporated herein by reference.

BACKGROUND OF THE INVENTION

1. Field of the Invention

The present invention is related to electronic circuits, and more particularly, to a pixel circuit.

2. Description of the Prior Art

In comparison with a rolling shutter image sensor, all pixel units of a global shutter image sensor obtain image data in a same time interval, rather than row by row. For some considerations, however, the image data of respective pixel units are read out sequentially rather than concurrently. Therefore, an in-pixel storage mechanism is required, in order to hold image data of a certain pixel unit until this pixel unit is selected for performing a read-out operation.

The above mechanisms for global shutter still have some disadvantages. For example, as time intervals of respective pixel units within the global shutter image sensor for holding the image data may be different, and more particularly, a pixel unit to be read out later than others (e.g. any of the pixel units of the last row) may need to hold image data of this pixel unit for a long time. As a result, some side effects may be introduced. For example, the image data of this pixel unit may be inaccurate due to a leakage current. Thus, there is a need for a novel architecture of the pixel unit, to solve the aforementioned problems.

SUMMARY OF THE INVENTION

An objective of the present invention is to provide a pixel circuit, to solve the problems (e.g. in-pixel leakage current or read-out error that is related to the leakage current) of related arts.

At least one embodiment of the present invention provides a pixel circuit, where the pixel circuit comprises a photodiode (PD), a transmission circuit, a reset circuit, a signal storage circuit and a buffer circuit. The transmission circuit is coupled between the PD and an ordinary floating diffusion (FD) node, the reset circuit is coupled to the ordinary FD node, the signal storage circuit is coupled to the ordinary FD node, and the buffer circuit is coupled to the signal storage circuit. The PD is arranged to accumulate charges in response to incident radiation, to generate a PD signal. The transmission circuit is arranged to transmit the PD signal to the ordinary FD node. The reset circuit is arranged to reset the ordinary FD node and provide a reference signal. The signal storage circuit is arranged to store the PD signal on a specific node having a reduced leakage path in comparison with the ordinary FD node during a holding phase of the pixel circuit. For example, the holding phase may be a time interval starting from a first time point at which the PD signal is stored on the specific node and ending at a second time point at which the pixel circuit is selected for performing a read-out operation. The buffer circuit is arranged to buffer pixel signals of the pixel circuit, to generate output signals for being read out when the pixel circuit is selected for performing the read-out operation, and more particularly, the pixel signals comprise the PD signal and the reference signal.

At least one embodiment of the present invention provides a pixel circuit, where the pixel circuit comprises a photodiode (PD), a transmission circuit, a reset circuit, a signal storage circuit and a buffer circuit. The transmission circuit is coupled between the PD and an ordinary floating diffusion (FD) node, the reset circuit is coupled to the ordinary FD node, the signal storage circuit is coupled to the ordinary FD node, and the buffer circuit is coupled to the ordinary FD node. The PD is arranged to accumulate charges in response to incident radiation, to generate a PD signal. The transmission circuit is arranged to transmit the PD signal to the ordinary FD node. The reset circuit is arranged to reset the ordinary FD node and provide a reference signal. The signal storage circuit is arranged to store the PD signal on a specific node having a reduced leakage path in comparison with the ordinary FD node during a holding phase of the pixel circuit. For example, the holding phase may be a time interval starting from a first time point at which the PD signal is stored on the specific node and ending at a second time point at which the pixel circuit is selected for performing a read-out operation. The buffer circuit is arranged to buffer pixel signals of the pixel circuit, to generate output signals for being read out when the pixel circuit is selected for performing the read-out operation, and more particularly, the pixel signals comprise the PD signal and the reference signal.

One of advantages of the present invention is that the present invention architecture of the pixel circuit provides a storage node having a reduced leakage path for the PD signal. As a result, signal error caused by the side effects such as the leakage current can be reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
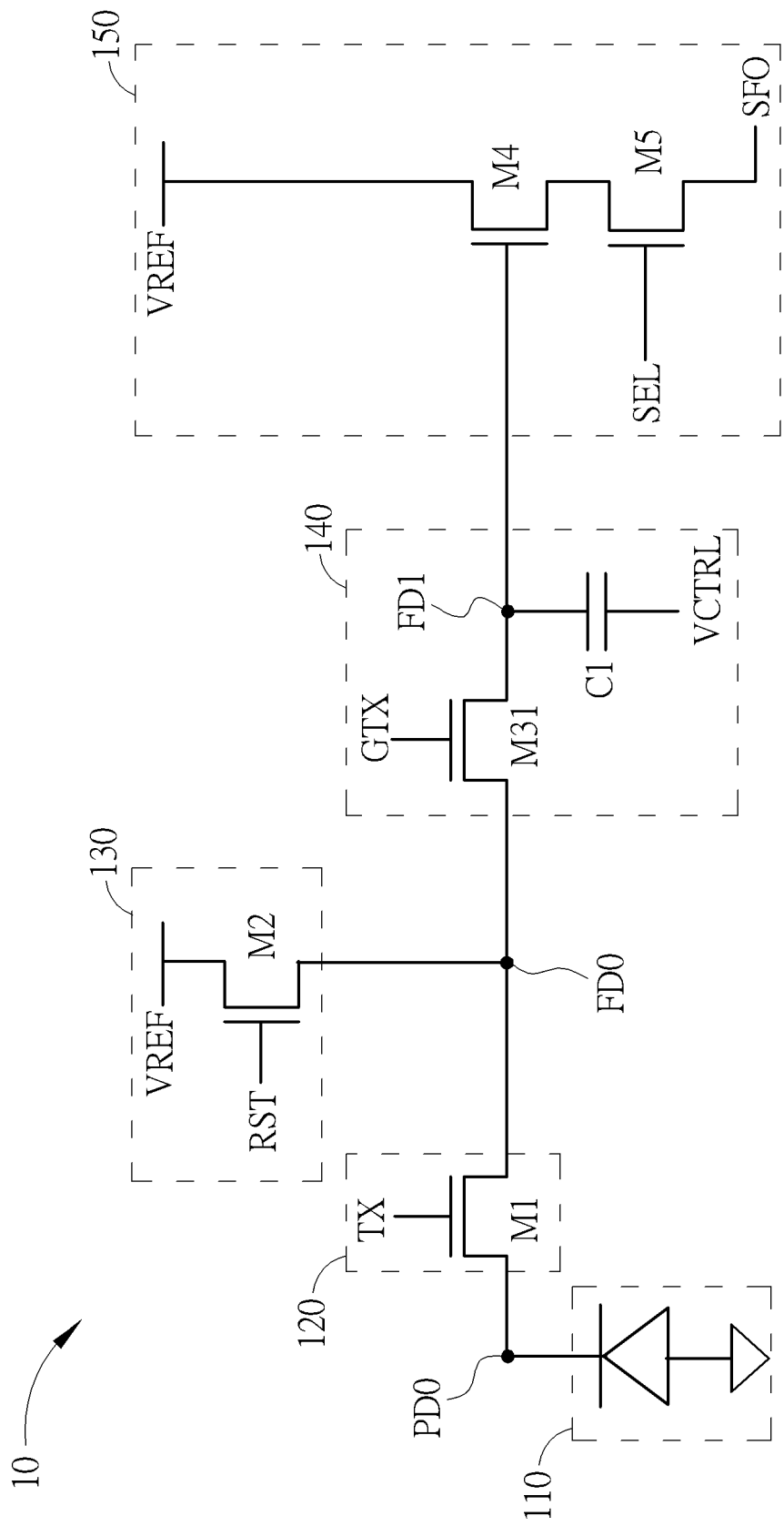
FIG. 1 is a diagram illustrating a pixel circuit according to an embodiment of the present invention.

FIG. 1 is a diagram illustrating a pixel circuit 10 according to an embodiment of the present invention. The pixel circuit 10 may comprise a PD 110, a transmission circuit 120, a reset circuit 130, a signal storage circuit 140 and a buffer circuit 150. The transmission circuit 120 is coupled between the PD 110 and an FD node FD0, the reset circuit 130 is coupled to the FD node FD0, the signal storage circuit 140 is coupled to the FD node FD0, and the buffer circuit 150 is coupled to the signal storage circuit 140.

In this embodiment, the PD 110 is coupled to the transmission circuit 120 through a PD node PD0, and the PD 110 may accumulate charges on the PD node PD0 in response to incident radiation, to generate a PD signal on the PD node PD0. The transmission circuit 120 may comprise at least one transistor such as a transistor M1, where a gate terminal of the transistor M1 is coupled to a control signal TX. The reset circuit 130 may comprise at least one transistor such as a transistor M2, where a gate terminal of the transistor M2 is coupled to a control signal RST. The signal storage circuit 140 may comprise a first switch circuit and a capacitor C1, where the first switch circuit may comprise at least one transistor such as a transistor M31. A gate terminal of the transistor M31 is coupled to a control signal GTX, and the capacitor C1 is coupled between the FD node FD1 and a control voltage VCTRL. The buffer circuit 150 may comprise a source follower and a selecting circuit, where the source follower may comprise a transistor M4, and the selecting circuit may comprise at least one transistor such as a transistor M5. A drain terminal and a gate terminal of the transistor M4 are coupled to the reference voltage VREF and the signal storage circuit 140 (e.g. the FD node FD1), respectively. The transistor M5 is coupled between a source terminal of the transistor M4 and an output terminal SFO, and a gate terminal of the transistor M5 is coupled to a control signal SEL. When a state of the control signal SEL is high (i.e. logic high), the buffer circuit may be enabled, and the buffer circuit may buffer an input signal (e.g. any pixel signal), to generate an output signal (e.g. an output voltage) on the output terminal SFO according to the input signal (i.e. an input voltage) on the gate terminal of the transistor M4. For example, when the control signal SEL is high, the transistor M4 may transmit the input voltage from the gate terminal of the transistor M4 to the source terminal of the transistor M4, to generate the output voltage, and the transistor M5 may output the output voltage to the output terminal SFO. Additionally, there may be a current source (not shown) coupled to the output terminal SFO to provide a bias current for the buffer circuit 150, but the present invention is not limited thereto.

Figure 2:
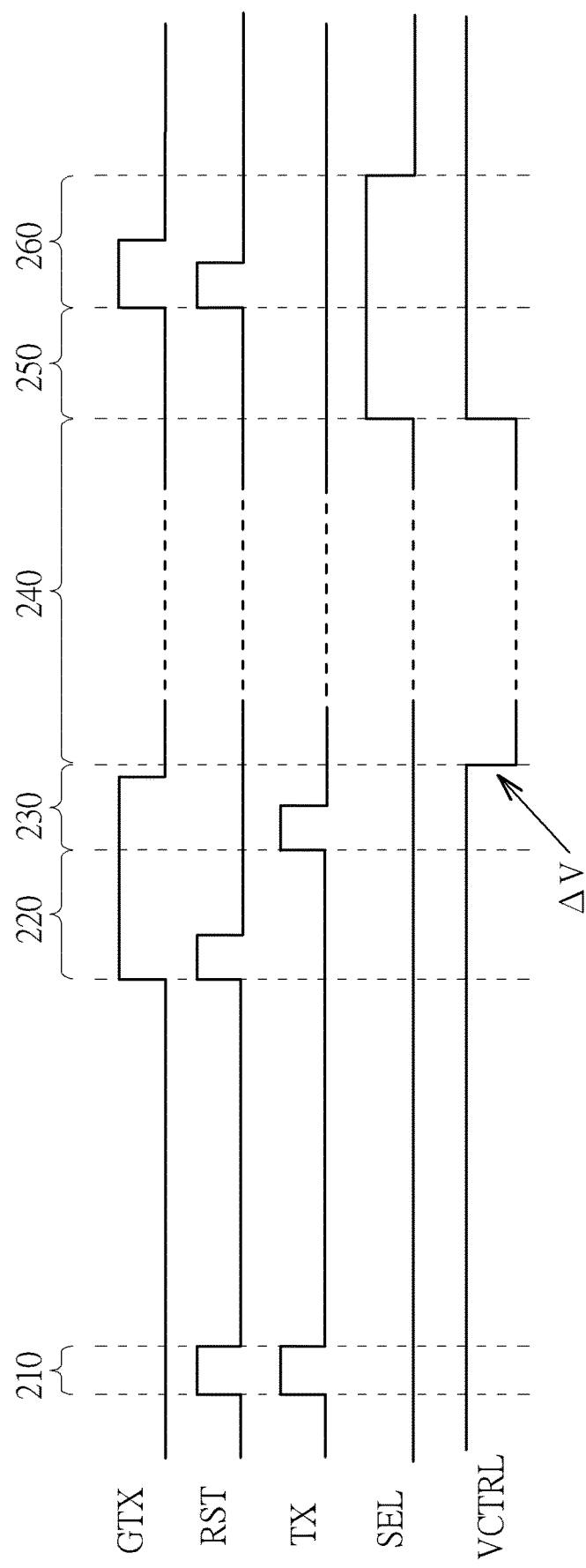
FIG. 2 is a timing diagram illustrating control signals and a control voltage shown in FIG. 1 according to an embodiment of the present invention.

Referring to FIG. 2 in conjunction with FIG. 1, FIG. 2 is a timing diagram illustrating the control signals GTX, RST, TX and SEL and the control voltage VCTRL shown in FIG. 1 according to an embodiment of the present invention. It should be noted that the timing diagram shown in FIG. 2 is for illustrative purposes only, and is not meant to be a limitation of the present invention. During a phase 210, when states of the control signals RST and TX are high (i.e. logic high) and a state of the control signal GTX is low (i.e. logic low), the PD node PD0 and the FD node FD0 may be reset to a reference level, concurrently. In some embodiments, there may be an additional reset circuit (similar to the reset circuit 130) coupling to the PD node PD0, in order to reset the PD node PD0, but the present invention is not limited thereto. After the states of the control signals RST and TX turn to low, the PD 110 may start to accumulate charges in response to incident radiation (e.g. exposure while taking a photo) to generate a PD signal (e.g. image data) on the PD node PD0. During a phase 220, when the states of the control signals GTX and RST are high and the control signal TX is low, the FD node FD1 may be reset to the reference level. During a phase 230, when the states of the control signals GTX and TX are high and the state of the control signal RST is low, the transmission circuit 120 may transmit the PD signal to the FD node FD0 and the signal storage circuit 140, and when the states of the control signals GTX and TX turn to low, the PD signal may be stored in the signal storage circuit 140 (e.g. stored on the FD node FD1).

For a global shutter image sensor, there is a need for holding image data (e.g. the PD signal stored in the signal storage circuit 140) until the pixel circuit 10 is selected for performing a read-out operation. As shown in FIG. 1, comparing with the FD node FD0, the FD node FD1 may have a reduced leakage path during a holding phase of the pixel circuit 10, wherein the holding phase is a time interval starting from a first time point at which the PD signal is stored on the FD node FD1 and ending at a second time point at which the pixel circuit is selected for performing the read-out operation. That is, a number of leakage path(s) of the FD node FD1 may be less than that of the FD node FD0. The FD node FD1 is therefore less affected by a leakage current.

Referring to FIG. 2 in conjunction with FIG. 1, in order to further reduce the leakage current, a voltage drop ΔV may be applied to the control voltage VCTRL to pull down a voltage level of the PD signal stored on the FD node FD1 to a lower level during the holding phase (e.g. a phase 240 shown in FIG. 2). As the voltage level of the PD signal stored on the FD node FD1 during the phase 240 is reduced with the voltage drop ΔV, the leakage current is further reduced. In some embodiments, the control voltage VCTRL and the capacitor C1 may be omitted, but the present invention is not limited thereto. In this embodiment, the transistor M2 is turned off during the holding phase (e.g. the phase 240 shown in FIG. 2) of the pixel circuit 10, but the present invention is not limited thereto. In some embodiments, the reset circuit 130 may reset the FD node FD0 during the holding phase of the pixel circuit 10, and more particularly, the control signal RST may be adjusted to be logic high during the holding phase, to turn on the transistor M2, but the present invention is not limited thereto. For example, in a strong light condition, a great number of electrons (e.g. overflow electrons) may be accumulated on the PD node PD0, and the transistors M1 and M31 are hard to be completely turned off in real cases. If the transistor M2 is turned on during the holding phase of the pixel circuit 10, the reference voltage VREF may absorb these overflow electrons that leak to the FD node FD0 from the PD node PD0, in order to prevent the FD node FD1 from being affected by these overflow electrons.

Referring to FIG. 2 in conjunction with FIG. 1, when the control signal SEL turns to high, which indicates that the pixel circuit 10 is selected for performing the read-out operation, the voltage drop ΔV applied to the control voltage VCTRL may be removed, and the voltage level of the PD signal stored on the FD node FD1 may recover from the lower level. During a phase 250, when the states of the control signals GTX, RST and TX are low, the buffer circuit 150 may generate a first output signal on the output terminal SFO according to the PD signal. During a phase 260, when the control signals GTX and RST are high and the control signal TX is low, the reference signal may be transmitted from the reference voltage VREF to the FD node FD1, and the buffer circuit 150 may generate a second output signal on the output terminal SFO according to the reference signal.

Figure 3:
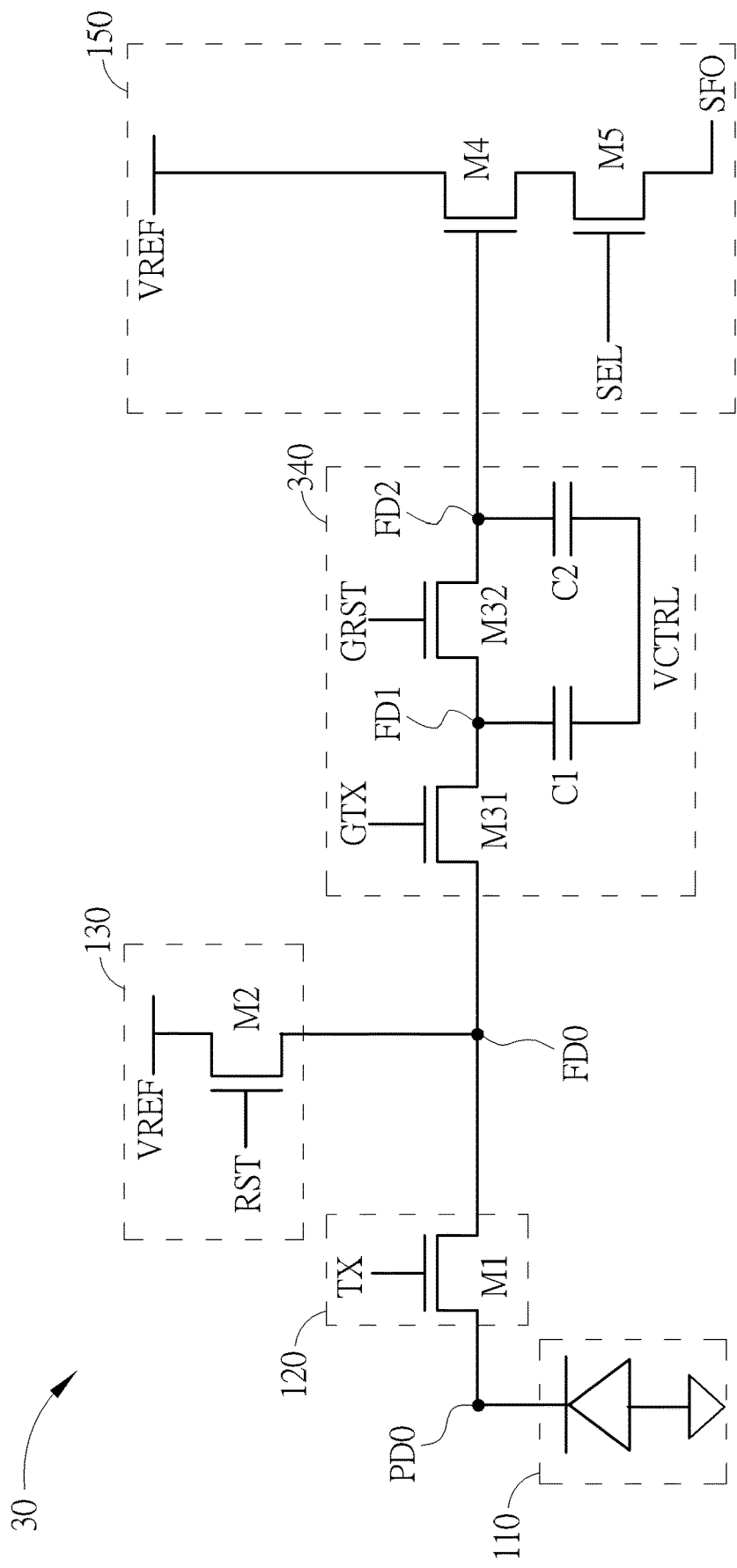
FIG. 3 is a diagram illustrating a pixel circuit according to an embodiment of the present invention.

FIG. 3 is a diagram illustrating a pixel circuit 30 according to an embodiment of the present invention. The main difference between the pixel circuit 10 in FIG. 1 and the pixel circuit 30 is the change in architecture of the signal storage circuit therein, for example, the signal storage circuit 140 in FIG. 1 may be replaced by a signal storage circuit 340 in this embodiment. More particularly, in addition to the transistor M31 and the capacitor C1 which are the same as that of the storage circuit 140, the signal storage circuit 340 may further comprise a transistor M32 and a capacitor C2. The transistor is coupled between the FD node FD1 and a FD node FD2, where a gate terminal of the transistor M32 is coupled to a control signal GRST. The capacitor is coupled between the FD node FD2 and the control voltage VCTRL. In addition, the buffer circuit 150 (the gate terminal of the transistor M4) is coupled to the FD node FD2 rather than the FD node FD1.

Figure 4:
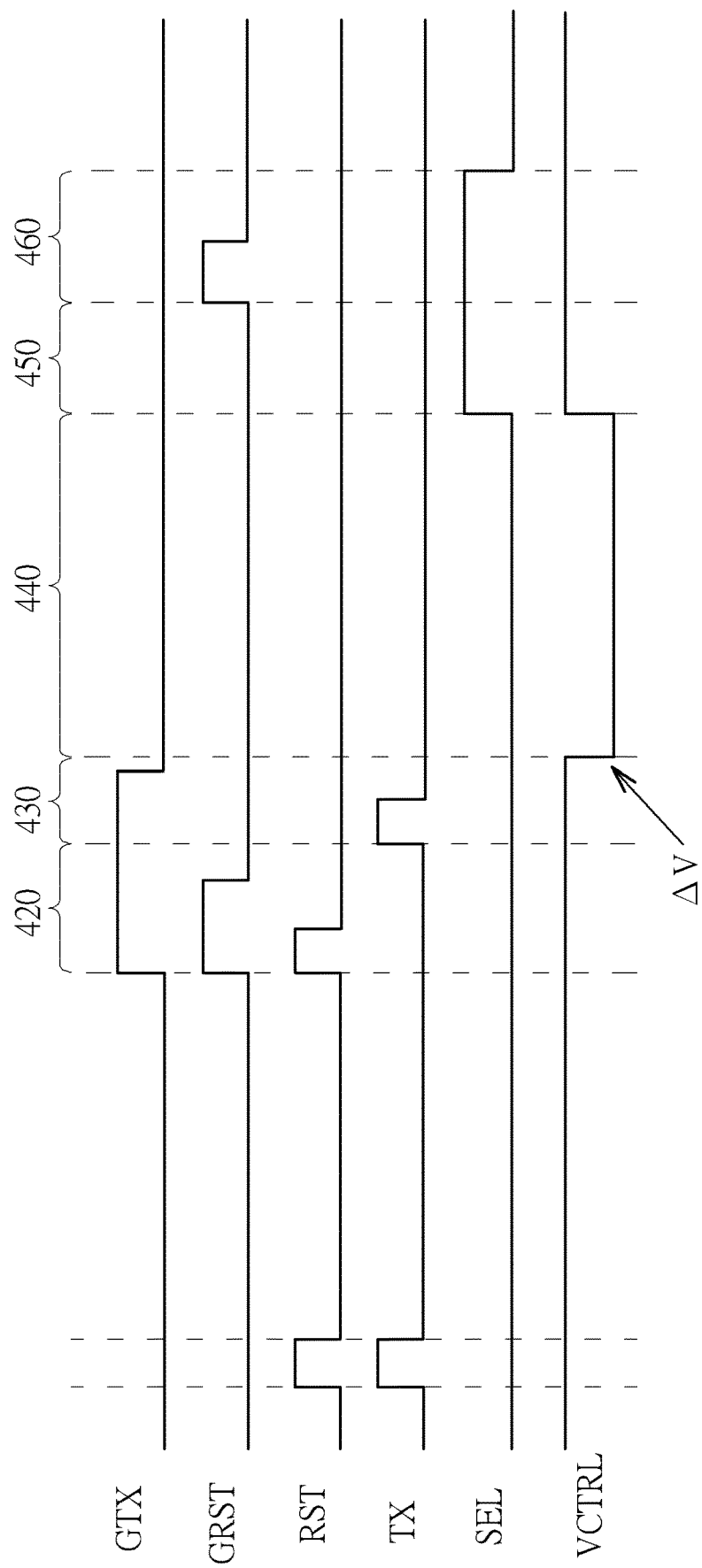
FIG. 4 is a timing diagram illustrating the control signals and the control voltage shown in FIG. 3 according to an embodiment of the present invention.

Referring to FIG. 4 in conjunction with FIG. 3, FIG. 4 is a timing diagram illustrating the control signals GTX, GRST, RST, TX and SEL and the control voltage VCTRL shown in FIG. 3 according to an embodiment of the present invention. It should be noted that the timing diagram shown in FIG. 4 is for illustrative purposes only, and is not meant to be a limitation of the present invention. As operations before a phase 420 in this embodiment are similar to that in the embodiments shown in FIGS. 1 and 2, similar descriptions for this embodiment are not repeated in detail here. During the phase 420, when states of the control signals GTX, GRST and RST are high and the state of the control signal TX is low, the FD nodes FD1 and FD2 may be reset to the reference level, and when the states of the control signals GRST and RST turn to low, the reference signal may be stored in the signal storage circuit 340 (e.g. stored on the FD node FD2). During a phase 430, when the states of the control signals GTX and TX are high and the states of the control signals GRST and RST are low, the transmission circuit 120 may transmit the PD signal to the FD node FD0 and the signal storage circuit 340 (i.e. the FD node FD1), and when the states of the control signals GTX and TX turn to low, the PD signal may be stored in the signal storage circuit 340 (e.g. stored on the FD node FD1).

Referring to FIG. 4 in conjunction with FIG. 3, in order to further reduce leakage currents, the voltage drop ΔV may be applied to the control voltage VCTRL to pull down voltage levels of the PD signal stored on the FD node FD1 and the reference signal stored on the FD node FD2 to lower levels during the holding phase (e.g. a phase 440 shown in FIG. 4). As a result, the leakage currents of the FD nodes FD1 and FD2 are further reduced. In some embodiments, the control voltage VCTRL and the capacitors C1 and C2 may be omitted, but the present invention is not limited thereto. In this embodiment, the transistor M2 is turned off during the holding phase (e.g. the phase 440 shown in FIG. 4) of the pixel circuit 30, but the present invention is not limited thereto. In some embodiments, the reset circuit 130 may reset the FD node FD0 during the holding phase of the pixel circuit 30, and more particularly, the control signal RST may be adjusted to be logic high during the holding phase, to turn on the transistor M2, but the present invention is not limited thereto. For example, in a strong light condition, a great number of electrons (e.g. overflow electrons) may be accumulated on the PD node PD0, and the transistors M1 and M31 are hard to be completely turned off in real cases. If the transistor M2 is turned on during the holding phase of the pixel circuit 30, the reference voltage VREF may absorb these overflow electrons that leak to the FD node FD0 from the PD node PD0, in order to prevent the FD node FD1 from being affected by these overflow electrons.

Referring to FIG. 4 in conjunction with FIG. 3, when the control signal SEL turns to high, which indicates that the pixel circuit 30 is selected for performing the read-out operation, the voltage drop ΔV applied to the control voltage VCTRL may be removed, and the voltage levels of the PD signal stored on the FD node FD1 and the reference signal stored on the FD node FD2 may recover from the lower levels. During a phase 450, when the states of the control signals GTX, GRST, RST and TX are low, the buffer circuit 150 may generate a first output signal on the output terminal SFO according to the reference signal. During a phase 460, when the control signal GRST is high and the states of the control signals GTX, RST and TX are low, the transistor M32 may transmit the PD signal from the FD node FD1 to the FD node FD2, and the buffer circuit 150 may generate a second output signal on the output terminal SFO according to the PD signal.

For the architecture shown in FIG. 3, a difference between the first output signal (which may represent the reference signal in this embodiment) and the second output signal (which may represent the PD signal in this embodiment) can be less affected by the leakage currents. For example, assuming that real voltage levels of the PD signal and the reference signal are ($V_{FD1}-E_{FD1}$) and ($V_{FD2}-E_{FD2}$), respectively (where $V_{FD1}$ and $V_{FD1}$ respectively represent ideal voltage levels of the PD signal and the reference signal, and $E_{FD1}$ and $E_{FD2}$ respectively represent error caused by leakage currents of the FD node FD1 and FD2), the difference between the PD signal and the reference signal may be ($V_{FD1}-E_{FD1}$)-($V_{FD2}-E_{FD2}$), which indicate that the error can be reduced.

Figure 5:
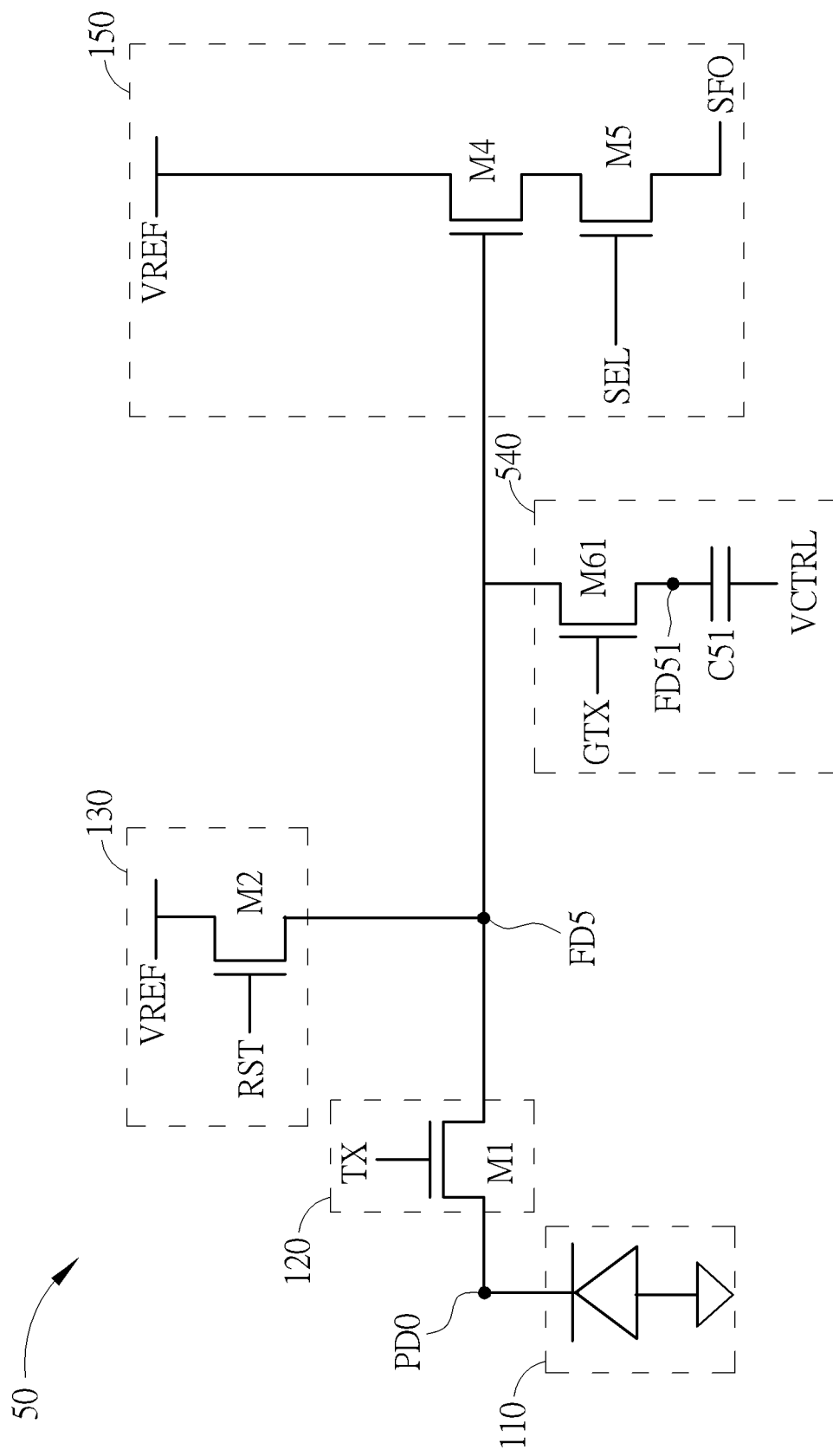
FIG. 5 is a diagram illustrating a pixel circuit according to an embodiment of the present invention.

FIG. 5 is a diagram illustrating a pixel circuit 50 according to an embodiment of the present invention. The pixel circuit 50 may comprise the PD 110, the transmission circuit 120, the reset circuit 130, a signal storage circuit 540 and the buffer circuit 150. The transmission circuit 120 is coupled between the PD 110 and an FD node FD5, and the reset circuit 130, the signal storage circuit 540 and the buffer circuit 150 are coupled to the FD node FD5.

As shown in FIG. 5, the signal storage circuit 540 may comprise a switch circuit and a capacitor C51, where this switch circuit may comprise at least one transistor such as a transistor M61 coupled between the FD node FD5 and an FD node FD51, and a gate terminal of the transistor M61 is coupled to the control signal GTX. The capacitor C51 is coupled between the FD node FD51 and the control voltage VCTRL. For brevity, similar descriptions for this embodiment are not repeated in detail here.

Figure 6:
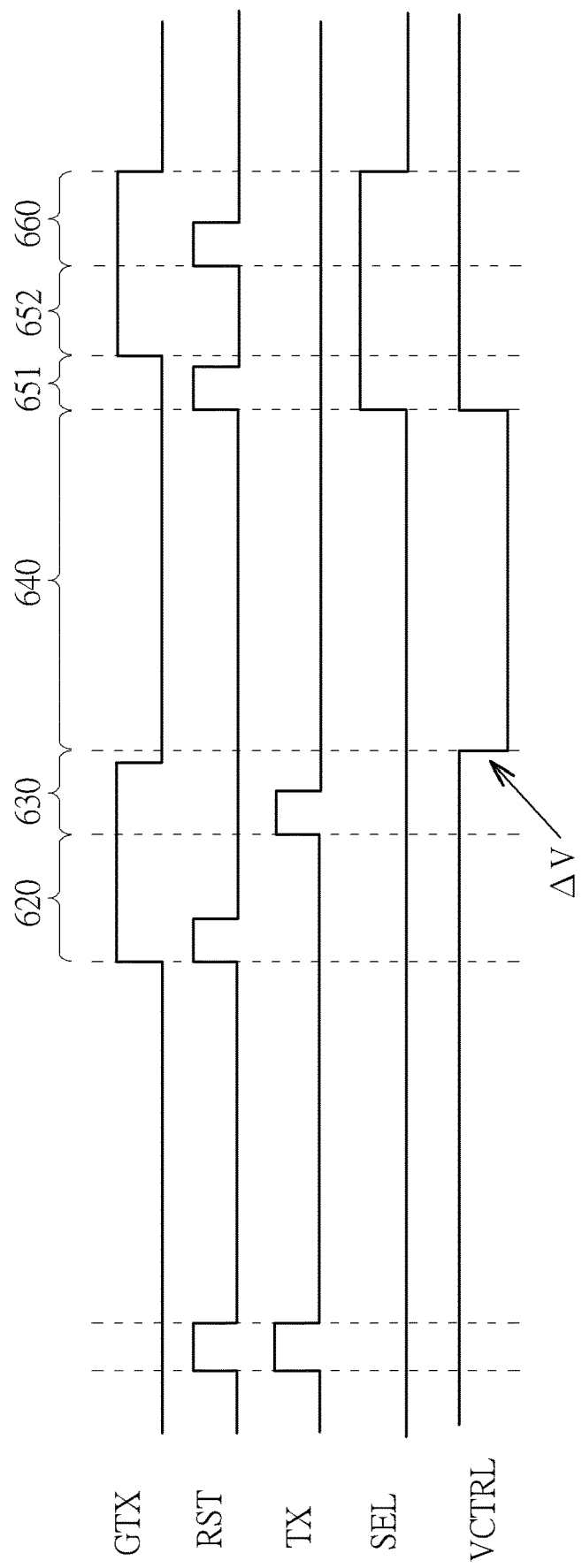
FIG. 6 is a timing diagram illustrating the control signals and the control voltage shown in FIG. 5 according to an embodiment of the present invention.

Referring to FIG. 6 in conjunction with FIG. 5, FIG. 6 is a timing diagram illustrating the control signals GTX, RST, TX and SEL and the control voltage VCTRL shown in FIG. 5 according to an embodiment of the present invention. It should be noted that the timing diagram shown in FIG. 2 is for illustrative purposes only, and is not meant to be a limitation of the present invention. As operations before a phase 620 in this embodiment are similar to that in the embodiments shown in FIGS. 1 and 2, similar descriptions for this embodiment are not repeated in detail here. During the phase 620, when the states of the control signals GTX and RST are high and the state of the control signal TX is low, the FD nodes FD5 and FD51 may be reset to the reference level. During a phase 630, when the states of the control signals GTX and TX are high and the state of the control signal RST is low, the transmission circuit 120 may transmit the PD signal to the FD nodes FD5 and the signal storage circuit 540, and when the states of the control signals GTX and TX turn to low, the PD signal may be stored in the signal storage circuit 540 (e.g. stored on the FD node FD51).

The advantages of this embodiment are similar to that of the previous embodiments. In comparison with the FD node FD5 in FIG. 5, the FD node FD51 in FIG. 5 may have a reduced leakage path during a holding phase (e.g. a phase 640 shown in FIG. 6) of the pixel circuit 50, and the FD node FD51 is therefore less affected by a leakage current.

Referring to FIG. 6 in conjunction with FIG. 5, in order to further reduce the leakage current, the voltage drop ΔV may be applied to the control voltage VCTRL to pull down a voltage level of the PD signal stored on the FD node FD51 to a lower level during the holding phase (e.g. the phase 640). As the voltage level of the PD signal stored on the FD node FD51 during the phase 640 is reduced with the voltage drop ΔV, the leakage current is further reduced. In some embodiments, the control voltage VCTRL may be a fixed reference voltage, but the present invention is not limited thereto. In this embodiment, the transistor M2 is turned off during the holding phase (e.g. the phase 640 shown in FIG. 6) of the pixel circuit 50, but the present invention is not limited thereto. In some embodiments, the reset circuit 130 may reset the FD node FD5 during the holding phase of the pixel circuit 50, and more particularly, the control signal RST may be adjusted to be logic high during the holding phase, to turn on the transistor M2, but the present invention is not limited thereto. For example, in a strong light condition, a great number of electrons (e.g. overflow electrons) may be accumulated on the PD node PD0, and the transistors M1 and M61 are hard to be completely turned off in real cases. If the transistor M2 is turned on during the holding phase of the pixel circuit 50, the reference voltage VREF may absorb these overflow electrons that leak to the FD node FD5 from the PD node PD0, in order to prevent the FD node FD51 from being affected by these overflow electrons.

Referring to FIG. 6 in conjunction with FIG. 5, when the control signal SEL turns to high, which indicates that the pixel circuit 50 is selected for performing the read-out operation, the voltage drop ΔV applied to the control voltage VCTRL may be removed, and the voltage level of the PD signal stored on the FD node FD51 may recover from the lower level. During a phase 651, when the control signal RST is high and the control signals GTX and TX are low, the FD node FD5 may be reset to the reference level. During a phase 652, when the control signal GTX is high and the control signals RST and TX are low, the transistor M61 may transmit the PD signal from the FD node FD51 to the FD node FD5, and the buffer circuit 150 may generate a first output signal on the output terminal SFO according to the PD signal. During a phase 660, when the control signals GTX and RST are high and the state of the control signal TX is low, the reference signal may be transmitted from the reference voltage VREF to the FD node FD5, and the buffer circuit 150 may generate a second output signal on the output terminal SFO according to the reference signal.

Figure 7:
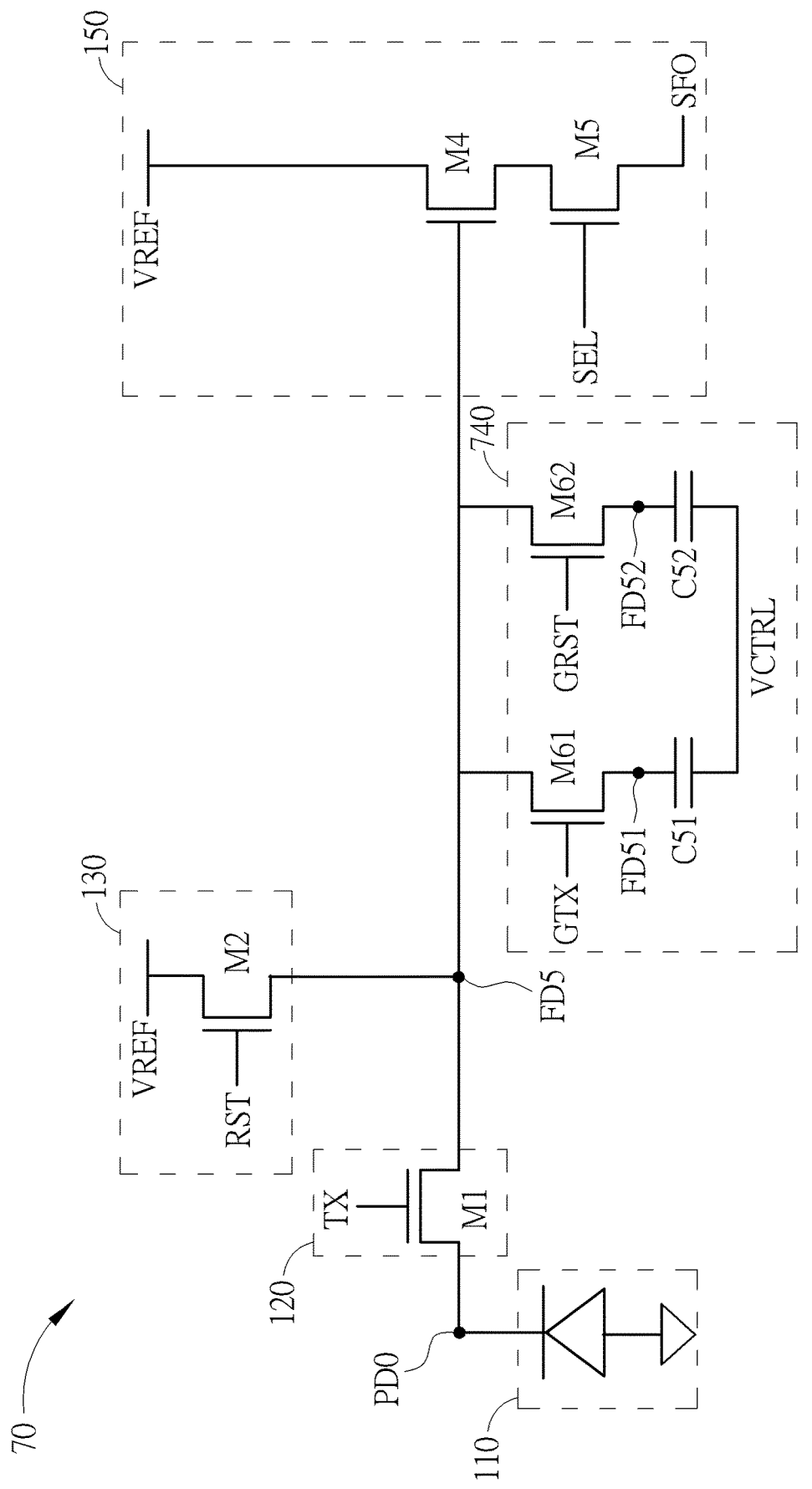
FIG. 7 is a diagram illustrating a pixel circuit according to an embodiment of the present invention.

FIG. 7 is a diagram illustrating a pixel circuit 70 according to an embodiment of the present invention. The main difference between the pixel circuit 50 in FIG. 5 and the pixel circuit 70 is the change in architecture of the signal storage circuit therein, for example, the signal storage circuit 540 in FIG. 5 may be replaced by a signal storage circuit 740 in this embodiment. More particularly, in addition to the transistor M61 and the capacitor C51 which are the same as that of the storage circuit 540, the signal storage circuit 740 may further comprise a transistor M62 and a capacitor C52. The transistor M62 is coupled between the FD node FD5 and a FD node FD52, where a gate terminal of the transistor M62 is coupled to the control signal GRST. The capacitor C52 is coupled between the FD node FD52 and the control voltage VCTRL.

Figure 8:
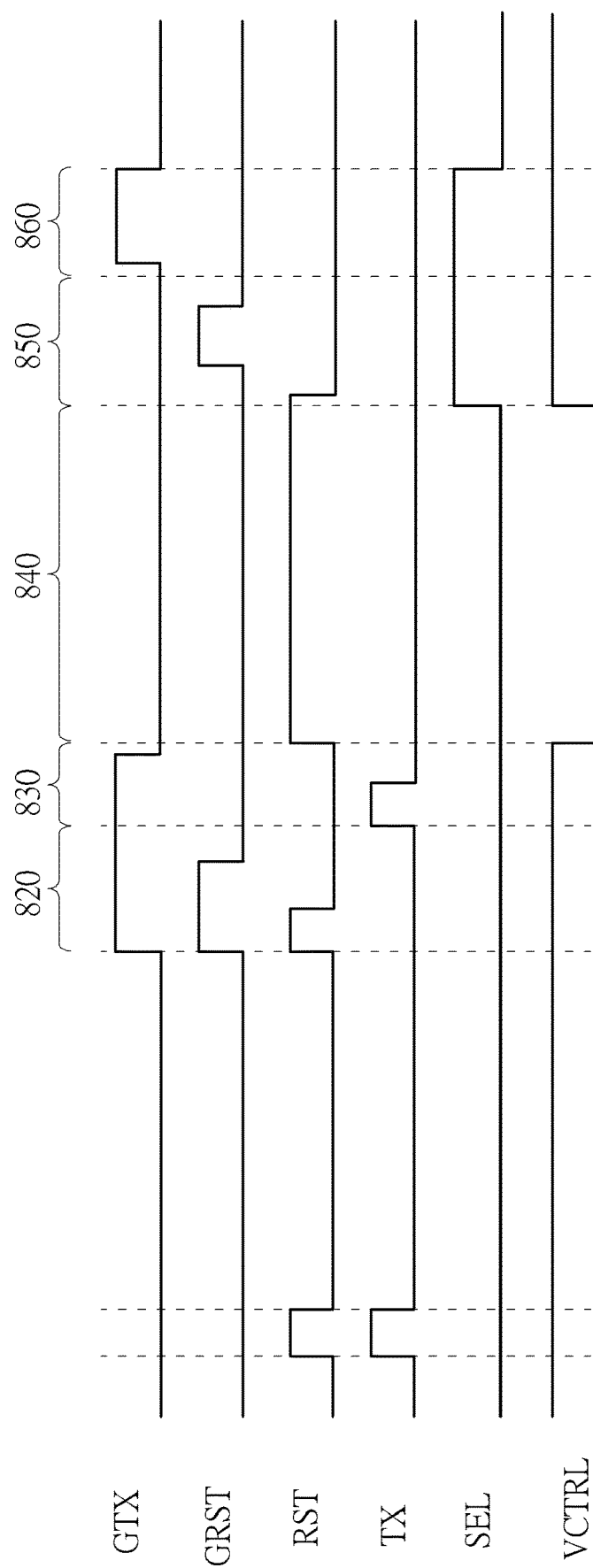
FIG. 8 is a timing diagram illustrating the control signals and the control voltage shown in FIG. 7 according to an embodiment of the present invention.

Referring to FIG. 8 in conjunction with FIG. 7, FIG. 8 is a timing diagram illustrating the control signals GTX, GRST, RST, TX and SEL and the control voltage VCTRL shown in FIG. 7 according to an embodiment of the present invention. It should be noted that the timing diagram shown in FIG. 8 is for illustrative purposes only, and is not meant to be a limitation of the present invention. As operations before a phase 820 in this embodiment are similar to that in the embodiments shown in FIGS. 1 and 2, similar descriptions for this embodiment are not repeated in detail here. During the phase 820, when the states of the control signals GTX, GRST and RST are high and the state of the control signal TX is low, the FD nodes FD5, FD51 and FD52 may be reset to the reference level, and when the states of the control signals GRST and RST turn to low, the reference signal may be stored in the signal storage circuit 740 (e.g. stored on the FD node FD52). During a phase 830, when the states of the control signals GTX and TX are high and the states of the control signal GRST and RST are low, the transmission circuit 120 may transmit the PD signal to the FD node FD5 and the signal storage circuit 340, and when the states of the control signals GTX and TX turn to low, the PD signal may be stored in the signal storage circuit 140 (e.g. stored on the FD node FD51). In another embodiment, according to a different timing control mechanism, the PD signal and the reference signal may be stored on the FD nodes FD52 and FD51, respectively, but the present invention is not limited thereto.

Referring to FIG. 8 in conjunction with FIG. 7, in order to further reduce leakage currents, the voltage drop ΔV may be applied to the control voltage VCTRL to pull down voltage levels of the PD signal stored on the FD node FD51 and the reference signal stored on the FD node FD52 to lower levels during the holding phase (e.g. a phase 840 shown in FIG. 8). As a result, the leakage currents of the FD nodes FD51 and FD52 are further reduced. In some embodiments, the control voltage VCTRL may be a fixed reference voltage, but the present invention is not limited thereto.

Referring to FIG. 8 in conjunction with FIG. 7, when the control signal SEL turns to high, which indicates that the pixel circuit 70 is selected for performing the read-out operation, the voltage drop ΔV applied to the control voltage VCTRL may be removed, and the voltage levels of the PD signal stored on the FD node FD51 and the reference signal stored on the FD node FD52 may recover from the lower levels. During a phase 850, when the state of the control signal GRST is high and the states of the control signals GTX, RST and TX are low, the transistor M62 may transmit the reference signal from the FD node FD52 to the FD node FD5, and the buffer circuit 150 may generate a first output signal on the output terminal SFO according to the reference signal. During a phase 860, when the state of the control signal GTX is high and the states of the control signals GRST, RST and TX are low, the transistor M61 may transmit the PD signal from the FD node FD51 to the FD node FD5, and the buffer circuit 150 may generate a second output signal on the output terminal SFO according to the PD signal.

With an advantage similar to that of the architecture shown in FIG. 3, difference output of the PD signal and the reference signal regarding the pixel circuit 70 can be less affected by the leakage currents. After reading the description of the previous embodiments, those skilled in the art should understand this advantage. For brevity, similar descriptions for the embodiment shown in FIG. 8 are not repeated in detail here.

Figure 9:
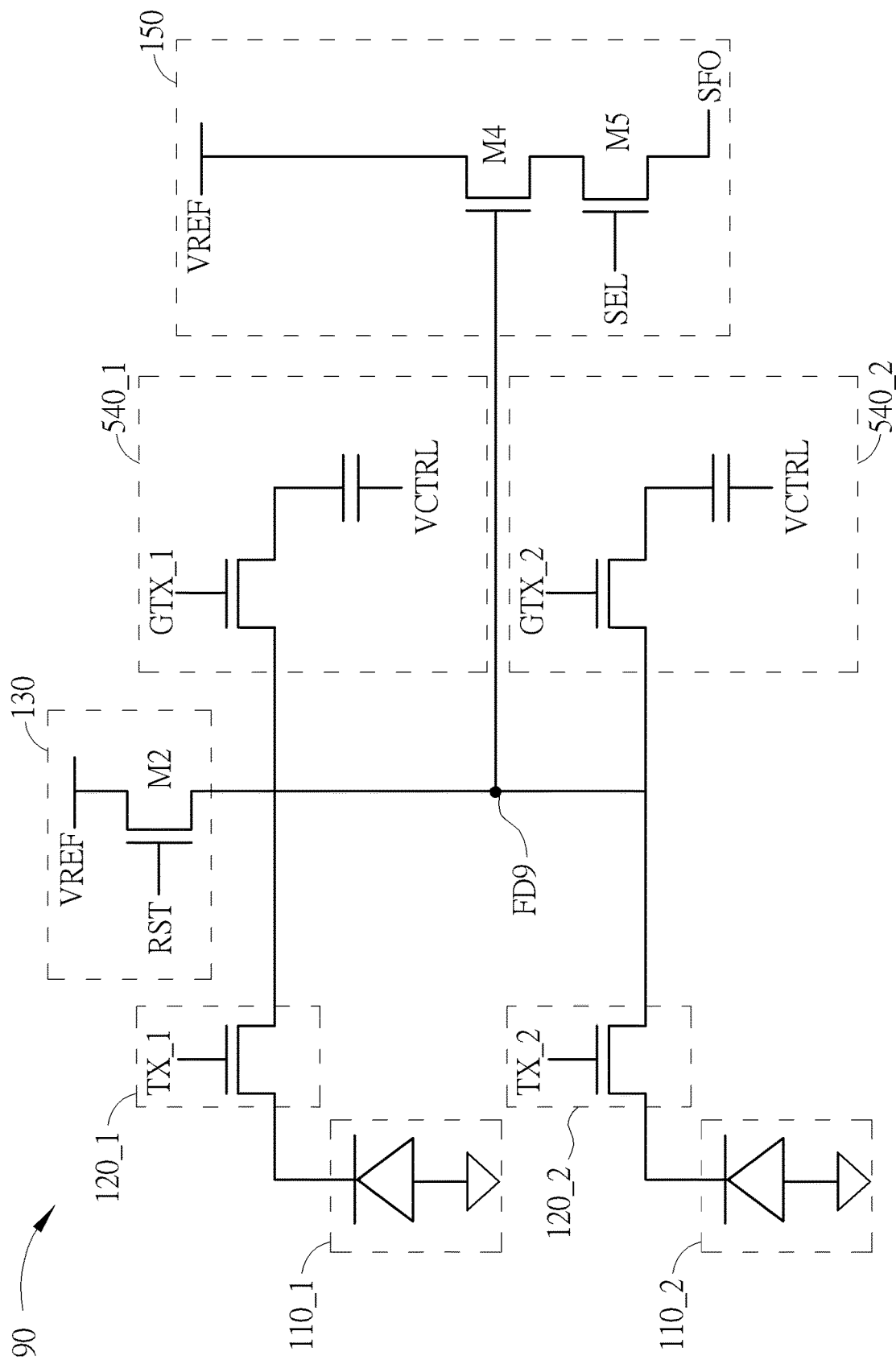
FIG. 9 illustrates a shared pixel circuit according to an embodiment of the present invention.

In some embodiments, the reset circuit 130, the buffer circuit 150 and an ordinary FD node (e.g. the FD node FD5 in FIG. 5) may be shared with one or more nearby pixel circuits. FIG. 9 illustrates a shared pixel circuit 90 according to an embodiment of the present invention. For example, the shared pixel circuit 90 may comprise two pixel circuits, where one of the two pixel circuits may comprise a PD 110_1, a transmission circuit 120_1, a signal storage circuit 540_1, the reset circuit 130 and the buffer circuit 150, and the other one of the two pixel circuits may comprise a PD 110_2, a transmission circuit 120_2, a signal storage circuit 540_2, the reset circuit 130 and the buffer circuit 150. Both of the two pixel circuits within the shared pixel circuit 90 may be examples of the pixel circuit 50 shown in FIG. 5. In other words, the two pixel circuits may share the reset circuit 130, the buffer circuit 150 and the ordinary FD node (e.g. an FD node FD9). For another example, the shared pixel circuit 90 may comprise three or more pixel circuits, any two of which are similar to each other, where the three or more pixel circuits may share the reset circuit 130, the buffer circuit 150 and the ordinary FD node, but the present invention is not limited thereto. After reading descriptions of the previous embodiments, those skilled in the art should understand the associated operations of the control signals TX_1, TX2, GTX_1, GTX_2, RST and SEL and the control voltage VCTRL of the shared pixel circuit 90. For brevity, similar descriptions for these embodiments are not repeated in detail here.

Figure 10:
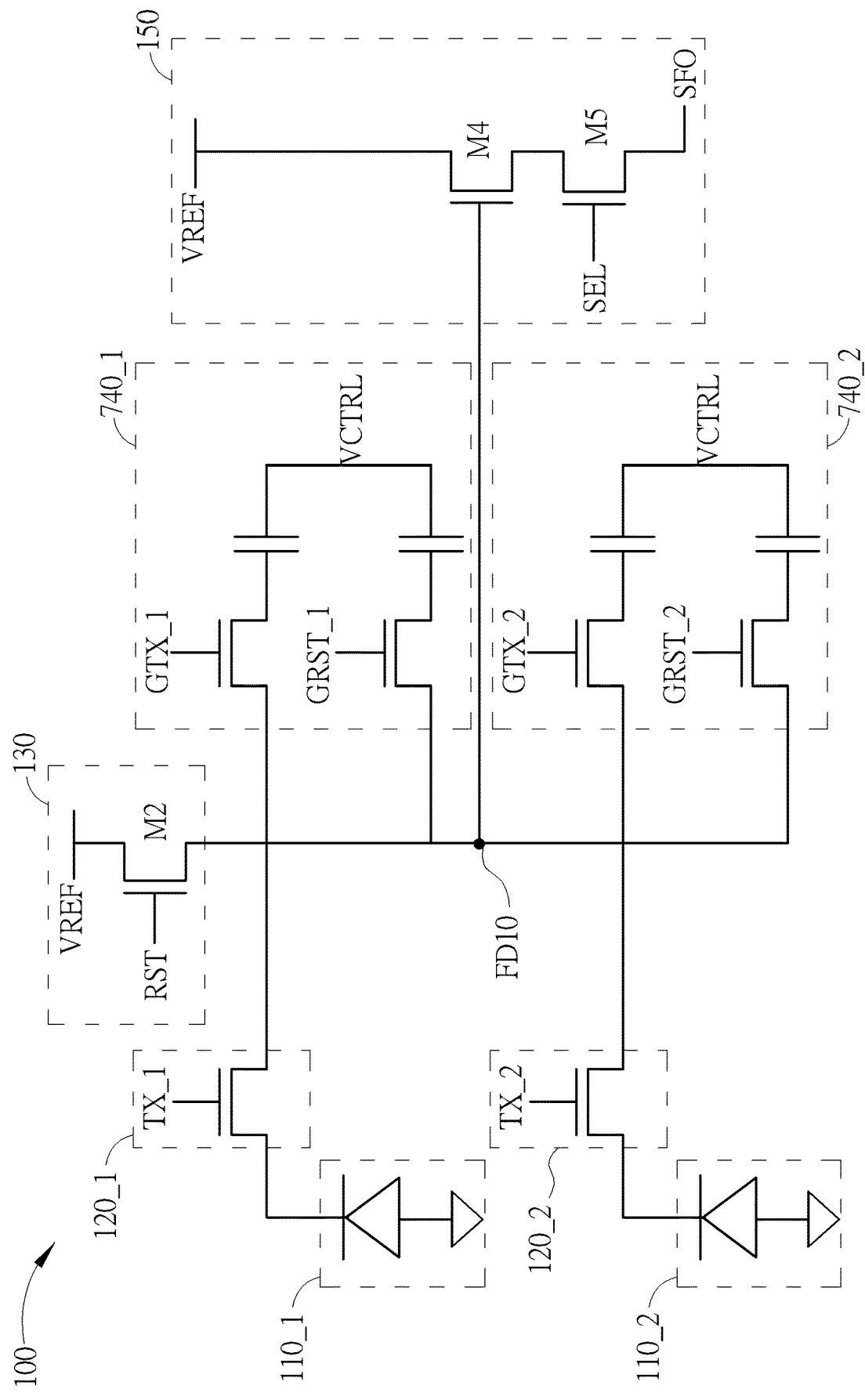
FIG. 10 illustrates a shared pixel circuit according to an embodiment of the present invention.

FIG. 10 illustrates a shared pixel circuit 100 according to an embodiment of the present invention. For example, the shared pixel circuit 100 may comprise two pixel circuits, where one of the two pixel circuits may comprise the PD 110_1, the transmission circuit 120_1, a signal storage circuit 740_1, the reset circuit 130 and the buffer circuit 150, and the other one of the two pixel circuits may comprise the PD 110_2, the transmission circuit 120_2, a signal storage circuit 740_2, the reset circuit 130 and the buffer circuit 150. Both of the two pixel circuits within the shared pixel circuit 100 may be examples of the pixel circuit 70 shown in FIG. 7. In other words, the two pixel circuits may share the reset circuit 130, the buffer circuit 150 and the ordinary FD node (e.g. an FD node FD10). For another example, the shared pixel circuit 100 may comprise three or more pixel circuits, any two of which are similar to each other, where the three or more pixel circuits may share the reset circuit 130, the buffer circuit 150 and the ordinary FD node, but the present invention is not limited thereto. After reading descriptions of the previous embodiments, those skilled in the art should understand the associated operations of the control signals TX_1, TX2, GTX_1, GTX_2, GRST_1, GRST_2, RST and SEL and the control voltage VCTRL of the shared pixel circuit 90. For brevity, similar descriptions for this embodiment are not repeated in detail here.

To summarize, the present invention architecture provides a storage node having a reduced leakage path for the PD signal. In addition, leakage currents can be further reduced via implementing the pixel circuit according the aforementioned embodiments. As a result, signal error caused by the side effects such as the leakage currents can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel circuit, comprising:
   a photodiode (PD), arranged to accumulate charges in response to incident radiation, to generate a PD signal;
   a transmission circuit, coupled between the PD and an ordinary floating diffusion (FD) node, arranged to transmit the PD signal to the ordinary FD node;
   a reset circuit, coupled to the ordinary FD node, arranged to reset the ordinary FD node and provide a reference signal;
   a signal storage circuit, coupled to the ordinary FD node, arranged to store the PD signal on a specific node having a reduced leakage path in comparison with the ordinary FD node during a holding phase of the pixel circuit, wherein the holding phase is a time interval starting from a first time point at which the PD signal is stored on the specific node and ending at a second time point at which the pixel circuit is selected for performing a read-out operation; and
   a buffer circuit, coupled to the ordinary FD node, arranged to buffer pixel signals of the pixel circuit, to generate output signals for being read out when the pixel circuit is selected for performing the read-out operation, wherein the pixel signals comprise the PD signal and the reference signal;
   wherein the signal storage circuit comprises:
   a first switch circuit, directly coupled between the ordinary FD node and a first FD node; and
   a first capacitor, coupled between the first FD node and a voltage control node;
   a second switch circuit, directly coupled between the ordinary FD node and a second FD node; and
   a second capacitor, coupled between the second FD node and a voltage control node;
   wherein:
   one of the first FD node and the second FD node is arranged to store the PD signal, and another one of the first FD node and the second FD node is arranged to store the reference signal; and
   each of the first switch circuit and the second switch circuit comprises at least one transistor.

2. The pixel circuit of claim 1, wherein the buffer circuit comprises:
   a source follower, comprising a first transistor, arranged to transmit the pixel signals from a gate terminal of the transistor to a source terminal of the transistor, to generate the output signals; and
   a selecting circuit, comprising at least one transistor, coupled between the source terminal of the first transistor and an output terminal, arranged to output the output signals of the pixel circuit when the pixel circuit is selected for performing the read-out operation.

3. The pixel circuit of claim 1, wherein each of the transmission circuit and the reset circuit comprises at least one transistor.

4. The pixel circuit of claim 1, wherein the reset circuit resets the ordinary FD node during the holding phase of the pixel circuit.

5. The pixel circuit of claim 1, wherein a voltage drop is applied to the voltage control node during the holding phase, to pull down a voltage level of the PD signal stored on the one of the first FD node and the second FD node during the holding phase, and to pull down a voltage level of the reference signal stored on said another one of the first FD node and the second FD node during the holding phase.

6. The pixel circuit of claim 5, wherein the ordinary FD node, the reset circuit and the buffer circuit are shared with one or more nearby pixel circuits.

7. The pixel circuit of claim 1, wherein the ordinary FD node, the reset circuit and the buffer circuit are shared with one or more nearby pixel circuits.

* * * * *